United States Patent

Glascock, II et al.

[11] 4,392,153
[45] Jul. 5, 1983

[54] COOLED SEMICONDUCTOR POWER MODULE INCLUDING STRUCTURED STRAIN BUFFERS WITHOUT DRY INTERFACES

[75] Inventors: Homer H. Glascock, II, Scotia; Douglas E. Houston, Ballston Lake; Michael H. McLaughlin; Harold F. Webster, both of Scotia, all of N.Y.

[73] Assignee: General Electric Company, Schenectady, N.Y.

[21] Appl. No.: 958,100

[22] Filed: Nov. 6, 1978

Related U.S. Application Data

[63] Continuation-in-part of Ser. No. 901,792, May 1, 1978.

[51] Int. Cl.³ .................. H01L 25/04; H01L 23/48; H01L 29/44
[52] U.S. Cl. .................................. 357/82; 357/65; 357/68; 357/79; 228/193
[58] Field of Search .................. 357/65, 66, 68, 79, 357/81, 82; 228/193, 194

[56] References Cited

U.S. PATENT DOCUMENTS

| | | | |
|---|---|---|---|
| 2,906,930 | 9/1959 | Raithel | 357/65 |
| 3,128,419 | 4/1964 | Waldkotter | 357/81 |
| 3,295,089 | 12/1966 | Moore | 357/81 |
| 3,387,191 | 6/1968 | Fishman et al. | 357/81 |
| 3,391,446 | 7/1968 | Buttle | 228/194 |
| 3,585,711 | 6/1971 | Hicks | 228/193 |
| 3,657,611 | 4/1972 | Yoneda | 357/81 |
| 3,678,570 | 7/1972 | Paulonis et al. | 228/194 |
| 3,739,235 | 6/1973 | Kessler | 357/81 |
| 3,761,783 | 9/1973 | Kroger et al. | 357/56 |
| 3,768,548 | 10/1973 | Dilay et al. | 357/82 |
| 3,787,958 | 1/1974 | Freedman | 228/193 |
| 3,858,096 | 12/1974 | Kuhrt et al. | 357/81 |
| 3,872,496 | 3/1975 | Potter | 357/81 |
| 3,969,754 | 7/1976 | Kuniya et al. | 357/66 |
| 4,099,201 | 7/1978 | Mueller | 357/81 |
| 4,156,458 | 5/1979 | Chu et al. | 357/81 |

FOREIGN PATENT DOCUMENTS 2003573 11/1969 France .................. 357/82

*Primary Examiner*—Andrew J. James
*Attorney, Agent, or Firm*—Marvin Snyder; James C. Davis, Jr.

[57] ABSTRACT

A semiconductor electronic device operates at high power levels using structured copper to reduce generation of stress between the elements of the device during thermal cycling in the course of normal operation. Structured copper strain buffers are used to attach each side of a silicon wafer to fluid cooled heat sinks to provide efficient removal of heat generated by the device and good electrical connection to the silicon wafer.

23 Claims, 13 Drawing Figures

COOLED SEMICONDUCTOR POWER MODULE INCLUDING STRUCTURED STRAIN BUFFERS WITHOUT DRY INTERFACES

This is a continuation-in-part of application Ser. No. 901,792, filed May 1, 1978.

BACKGROUND OF THE INVENTION

This invention relates to apparatus for cooling semiconductor devices and more particularly to apparatus for providing fluid cooling to semiconductor devices in order to achieve high power operation.

DESCRIPTION OF THE PRIOR ART

To achieve high power operation in semiconductor devices, it is necessary to provide an efficient means for removing heat. In semiconductor devices of the prior art utilizing a silicon wafer, one side of the silicon wafer has been attached to a tungsten disk by a silicon-aluminum braze to provide support for the fragile silicon wafer. Heat sinks, both air cooled and liquid cooled, have been placed on either or both sides of this structure. To obtain good thermal and electrical conductivity between the elements of the device, large mechanical presses have been necessary to squeeze the wafer-disk-heat sink structure together with several thousand pounds force. Large clamps are required to hold this structure together at this force level, even during device operation. However, a characteristic of such devices is that the interfaces between the heat sinks and the silicon wafer are dry. Dry interfaces are those interfaces where one surface is in contact with another but not joined thereto; consequently the thermal and electrical conductivities across these interfaces are limited. Thus, air and liquid cooled semiconductor devices of the prior art are limited in the amount of power they can handle because of the dry interfaces within the device. Additionally, differential thermal expansion and contraction between the elements of the device with variation of device temperature may cause scrubbing or even cracking of the silicon wafer.

The present invention concerns a fluid cooled semiconductor device in which the strain caused by differential thermal expansion and contraction has been reduced. As used herein, "fluid" may signify either a gas or a liquid. In the preferred embodiments of the invention, most interfaces between the heat sinks and silicon wafer are comprised of thermo-compression diffusion bonds. It should be apparent to those skilled in the art that improved electronic performance is to be gained by such stress reductions within the semiconductor device and by eliminating dry interfaces and their inherent limited thermal and electrical conductivity.

It is one object of this invention to provide a fluid cooled semiconductor device with increased electrical and thermal conductance between the elements thereof in order to achieve high power operation.

A further object of this invention is to provide a fluid cooled semiconductor device with reduced stress between the elements thereof.

These and other objects of the invention will become apparent to those skilled in the art upon consideration of the following description of the invention.

BRIEF SUMMARY OF THE INVENTION

The present invention is directed toward increasing the electrical and thermal conductances of the interfaces between the elements comprising a fluid cooled semiconductor device and reducing stress between these elements. In accordance with the invention, most of these interfaces are replaced by highly thermally conductive and highly electrically conductive thermo-compression diffusion bonds.

One preferred embodiment of the electronic semiconductor device of the invention includes a first metallic layer situated atop, and joined to, a first electrode of a silicon wafer having at least first and second electrodes on opposite sides thereof. A second metallic layer is situated atop and joined to this first metallic layer. A first structured copper strain buffer having first and second opposed surfaces is located above this second metallic layer and attached thereto. This structured copper strain buffer includes a bundle of substantially parallel closely packed strands of copper of substantially equal length. One common end of these strands of copper is thermo-compression diffusion bonded into a first metallic sheet so as to form the first opposed surface. The remaining second opposed surface of this first structured copper strain buffer is thermo-compression diffusion bonded into the second metallic layer. A first metallic heat sink is situated atop the first metallic sheet and thermo-compression diffusion bonded thereto to provide cooling of the semiconductor device.

A third metallic layer is situated below the second electrode of the silicon wafers and joined thereto. A fourth metallic layer is located below and joined to this third metallic layer. A second structured copper strain buffer having third and fourth opposed surfaces and being essentially identical to the one discussed above is situated below this fourth metallic layer and one common end of its copper strands is thermo-compression diffusion bonded into a second metallic sheet so as to form the fourth opposed surface. The remaining third opposed surface of this second structured copper strain buffer is thermo-compression diffusion bonded into the fourth metallic layer. A second metallic heat sink similar to the first metallic heat sink discussed above is thermo-compression diffusion bonded into the second metallic sheet.

Alternately, in accordance with the invention, electrical contacts are operatively connected to the side of the wafer including the second electrode, in lieu of attaching the third and fourth metallic layers, second structured copper strain buffer and second metallic heat sink thereto. In the electronic semiconductor device thus formed, the silicon wafer is provided with single-sided cooling.

Because thermo-compression diffusion bonds are present at the described interface locations, the above discussed embodiment of the invention includes no dry interfaces. Thus, thermal and electrical conduction across the interfaces of the device of the invention are not degraded by the limiting effects of dry interfaces. Heat is efficiently conducted away from the silicon wafer and electric current is efficiently provided to the silicon wafer.

In accordance with another preferred embodiment of the invention, a metallic support plate is situated between the silicon wafer and the third metallic layer of the first described embodiment. One side of the support plate is joined to the silicon wafer by a metallic braze. The opposite side of the support plate is thermo-compression diffusion bonded to the second structured copper strain buffer. In all other respects this embodiment of the invention is essentially identical to the first described embodiment. Alternately, the opposite side of the support plate is operatively connected to electrical contacts, in lieu of attaching the second structured copper strain buffer, the second metallic heat sink and associated metallic layers thereto.

In a further preferred embodiment of the invention, the silicon wafer may comprise a thyristor with an anode on one side thereof and constituting the second electrode, and a cathode and gate electrodes on the opposite side thereof and constituting a split first electrode. In this embodiment a means for connecting the gate to circuits external to the device is provided.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

DETAILED DESCRIPTION OF THE PREFERRED EMBODIMENT

Figure 1:
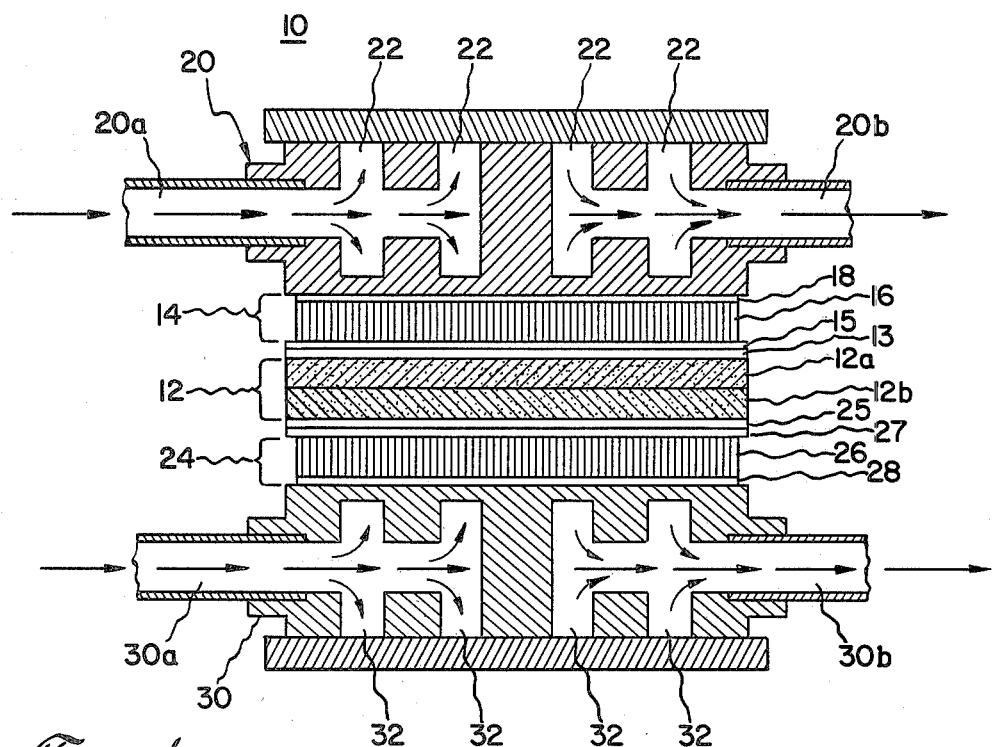
FIG. 1 is a cross-sectional view of one embodiment of a fluid cooled semiconductor device constructed in accordance with the present invention.

FIG. 1 illustrates one embodiment of the fluid cooled semiconductor device of the invention, wherein semiconductor device 10 is comprised of a silicon wafer 12 with cathode 12a and anode 12b portions on opposite sides thereof. Silicon wafer 12 may include a standard metallization applied to the external surfaces of each of electrodes 12a and 12b to facilitate electrical connection thereto.

A first metallic layer 13 is deposited in contact with cathode 12a of silicon wafer 12 as shown in FIG. 1. A second metallic layer 15 is deposited in contact with metallic layer 13. Metallic layer 13 may be comprised of titanium, chromium or nickel and metallic layer 15 may be comprised of gold, silver or copper. Second metallic layer 15 is situated in contact with one surface of structured copper strain buffer 14 as shown in FIG. 1. Structured copper strain buffer 14 is comprised of a bundle of substantially parallel closely packed strands of copper 16 of substantially equal length. One common end of copper strands 16 is thermo-compression diffusion bonded into metallic layer 15. The other common end of copper strands 16 is thermo-compression diffusion bonded into metallic sheet 18. Such a structured copper strain buffer is described and claimed in D. E. Houston's U.S. patent application, Ser. No. 944,372 (c.i.p. of Ser. No. 889,100, now abandoned) and assigned to the instant assignee, the disclosure thereof being incorporated herein by reference. Metallic sheet 18 may be comprised of highly electrically conductive metals such as copper, gold or silver, for example. Typically, the strands of copper 16 are each 10 mils in diameter, although somewhat larger or smaller diameters may be used. The thickness of structured copper strain buffer 14 is typically selected to be within the range of 0.1 cm. to 1 cm. although strain buffers of greater or smaller thickness may be used. Best strain relieving results are obtained when the natural oxide coating is present on the copper strands 16. With such a non-sticking coating present on the surface of copper strands 16, the individual strands are relatively free to move and thereby relieve stress when sandwiched between two surfaces, as is the case with the embodiment of the invention shown in FIG. 1.

Figure 2:
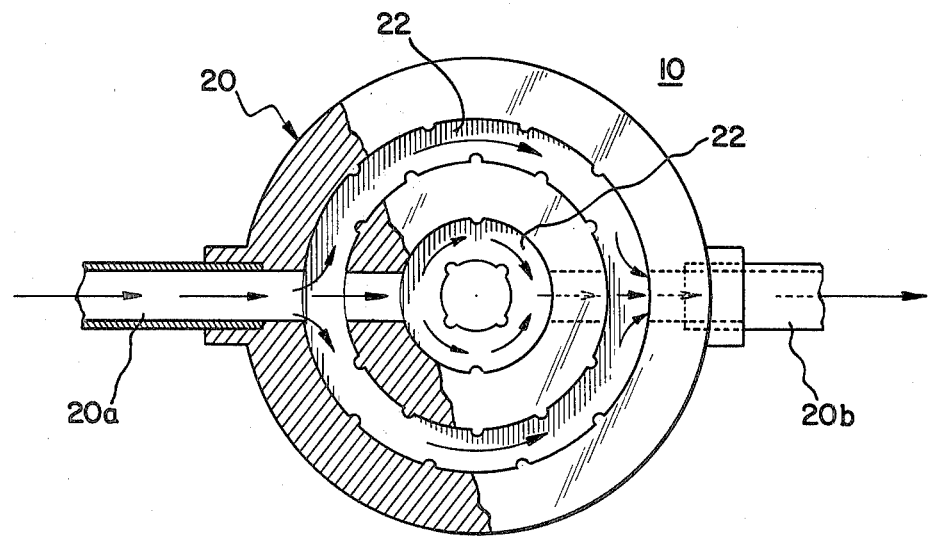
FIG. 2 is a top view of the fluid cooled semiconductor device of FIG. 1.

Metallic sheet 18 of structured copper strain buffer 14 is thermo-compression diffusion bonded to fluid cooled metallic heat sink 20. Heat sink 20 contains a chamber 22 within and has an input 20a to allow fluid to enter chamber 22. Heat sink 20 is provided with an output 20b to allow fluid passing through the chamber to exit the heat sink. Liquid and/or gas coolants may be passed through heat sink 20 to draw heat away from the heat sink. This results in the cooling of silicon wafer 12. For example, such fluids as water and the refrigerant R113 manufactured by the Dow Chemical Company may be used to achieve this cooling. The cooling fluid may be in both liquid and vapor phases as it passes through heat sink 20. The cooling fluid may be pressurized to assure that it remains in liquid phase as it passes through heat sink 20. Alternately, unpressurized fluids may be passed through heat sink 20 in order to achieve cooling. The geometry of the heat sink may vary. One version is shown in FIGS. 1 and 2, for example.

A third metallic layer 25 is deposited in contact with anode 12b of silicon wafer 12. A fourth metallic layer 27 is deposited in contact with metallic layer 25 as shown in FIG. 1. Metallic layer 25 may be comprised of titanium, chromium or nickel and metallic layer 27 may be comprised of gold, silver or copper. Fourth metallic layer 27 is situated in contact with one surface of structured copper strain buffer 24 as shown in FIG. 1. Structured copper strain buffer 24 (similar to structured copper strain buffer 14) is situated with one common end of its copper strands 26 thermo-compression diffusion bonded into fourth metallic layer 27. The remaining common end of copper strands 26 is thermo-compression diffusion bonded into a metallic sheet 28. Metallic sheet 28 is comprised of a highly electrically conductive material, for example, copper, gold or silver.

A metallic heat sink 30, essentially similar to heat sink 20, is thermo-compression diffusion bonded to metallic foil 28 of structured copper strain buffer 24. Heat sink 30 has an input 30a for receiving cooling fluid and an output 30b for exiting cooling fluid. Heat sink 30 includes a chamber 32 through which cooling fluid passes from input 30a to output 30b, resulting in the removal of heat generated by silicon wafer 12. Heat sinks 20 and 30 may be used to connect cathode 12a and anode 12b, respectively, to circuitry external to device 10.

Figure 7:
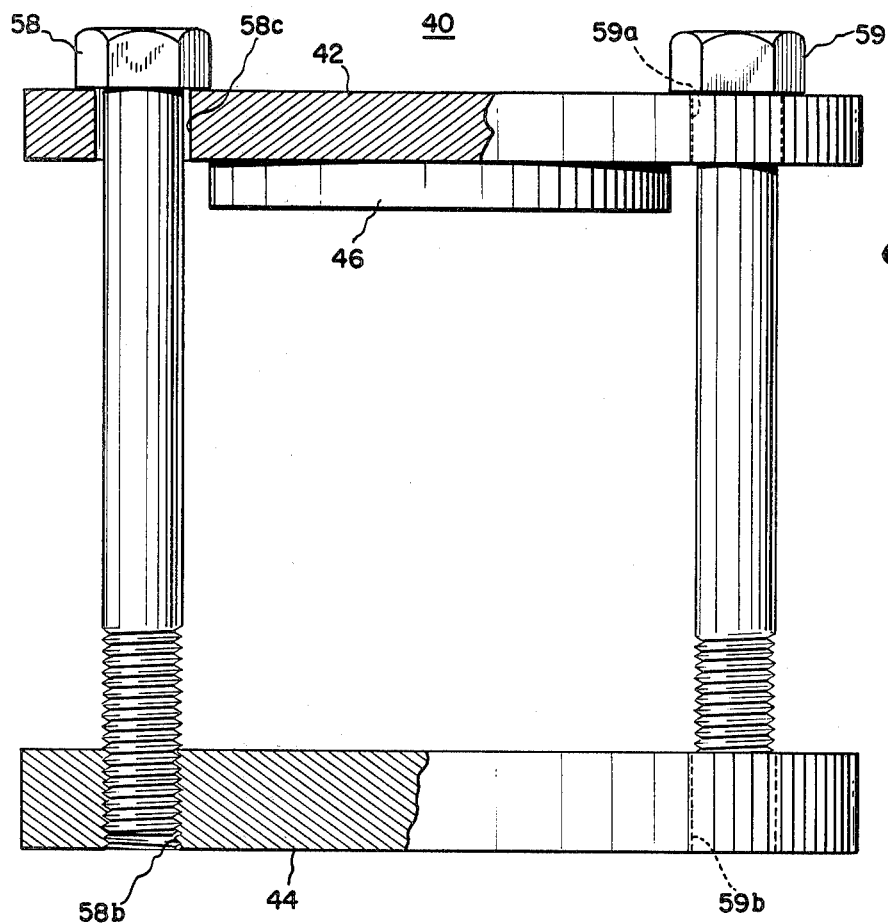
FIG. 7 is a side view of the diffusion bonding press used to form the thermo-compression diffusion bonds to the fluid cooled semiconductor device of the invention.

The diffusion bonding press 40 illustrated in FIG. 7 is used to form the thermo-compression diffusion bonds in the semiconductor device of the invention, such as those between structured copper strain buffer 14 and heat sink 20, and between structured copper strain buffer 24 and heat sink 30. Such a diffusion bonding press is described and claimed in D. E. Houston U.S. patent application Ser. No. 927,344, filed July 24, 1978, a c.i.p. of Ser. No. 889,099 (now abandoned) and assigned to the instant assignee, the disclosure thereof being incorporated herein by reference. Diffusion bonding press 40 is comprised of an upper metallic plate 42 oriented parallel to a lower metallic plate 44, with a space provided therebetween. Metallic pressing block 46 is positioned at the center of the side of upper plate 42 facing lower plate 44. Metallic bolts 58 and 59 pass through respective holes in upper plate 42 and lower plate 44 and are threaded into lower plate 44 to connect the two plates together as illustrated in FIG. 7.

Metallic bolts 58 and 59 are comprised of a steel other than stainless steel, while upper plate 42, lower plate 44 and metallic pressing block 46 are comprised of stainless steel. To achieve the thermo-compression diffusion bond between heat sink 20 and structured copper strain buffer 14, it is necessary to position heat sink 20 in contact with structured copper strain buffer 14, as shown in FIG. 1, and situate the combined structure of sink 20 and buffer 14 between metallic pressing block 46 and lower plate 44 of press 40. A conventional press is used to squeeze upper plate 42 and lower plate 44 together and while such pressure is applied to these plates, bolts 58 and 59 are tightened.

The thermo-compression diffusion bond between heat sink 20 and structured copper strain buffer 14 is actually formed when press 40 containing this sink-buffer assembly is placed in an inert atmosphere and heated at a temperature in the range of 300°-400° C. for an interval of approximately 15 minutes to 5 hours. When press 40 is so heated, upper plate 42, lower plate 44 and metallic pressing block 46 expand to a greater total extent than do nonstainless steel metallic bolts 58 and 59. Thus, a force is exerted between pressing block 46 and lower plate 44 resulting in the squeezing of heat sink 20 and structured copper strain buffer 14 together and the thermo-compression diffusion bonding of each to the other. The sink-buffer structure is then removed from diffusion bonding press 20.

The thermo-compression diffusion bond between heat sink 30 and structured copper strain buffer 24 is achieved in the same manner as described above. As a result of the thermo-compression diffusion bond formed between sink 20 and buffer 14, and between sink 30 and buffer 24, the cathode 12a of silicon wafer 12 (with metallic layers 13 and 15 thereon) is situated in abutting contact with buffer 14, and the anode 12b (with metallic layers 25 and 27 thereon) is situated in abutting contact with buffer 24 to form fluid cooled semiconductor device 10 of FIG. 1. To achieve even better cooling of silicon wafer 12, the above-mentioned "abutting contacts" may be replaced by thermo-compression diffusion bonds between the respective materials.

The term "element" as used herein designates any of the various layers and components constituting the fluid cooled semiconductor device to be described.

Figure 3:
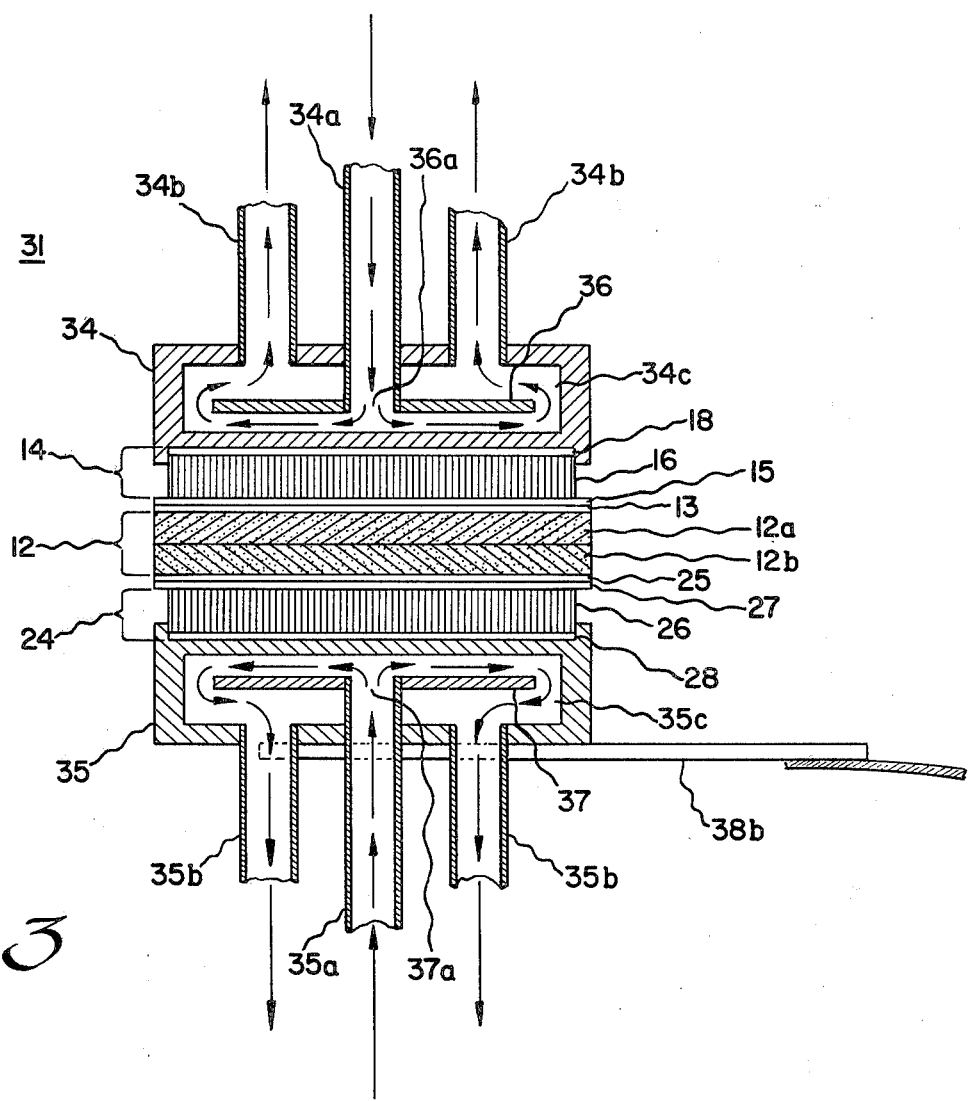
FIG. 3 is a cross-sectional view of another embodiment of the invention with thermo-compression diffusion bonds at selected interfaces within the device and with a fluid-cooled heat sink.

As mentioned above, many different geometries of fluid-cooled heat sinks may be used in practicing the invention. A preferred heat sink geometry is shown in FIG. 3 which illustrates a cooled semiconductor device 31 that is similar in structure and function to device 10 of FIG. 1 except for the geometry of heat sinks 34 and 35. Heat sink 34 comprises a metallic block including a cavity 34c with an inlet 34a for allowing cooling fluid to enter cavity 34c and outlets 34b to allow the cooling fluid to exit cavity 34c. A central plate 36 includes an aperture 36a connected to inlet 34a and causes the cooling fluid to be guided radially outward from the central portion of cavity 34c. The cooling fluid thus continuously flows across the bottom portion of cavity 34c in close proximity to the interface comprising the thermo-compression diffusion bond of structured copper strain buffer 14 to heat sink 34. Heat sink 35 is similar to heat sink 34 and is thermo-compression diffusion bonded to structured copper strain buffer 24. Heat sink 35 includes a metallic block having a cavity 35c, a fluid inlet 35a, fluid outlets 35b, and central plate 37 with aperture 37a.

Figure 4:
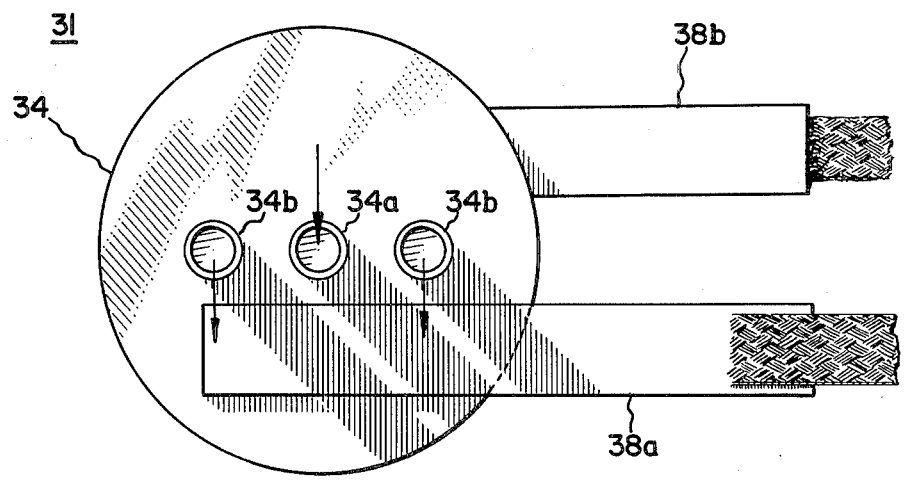
FIG. 4 is a top view of the embodiment of FIG. 3.

As shown in FIG. 4 and partially in FIG. 3, device 31 is provided with electrical contact bars 38a and 38b to facilitate connection of cathode 12a and anode 12b, respectively, to external circuitry.

Figure 5:
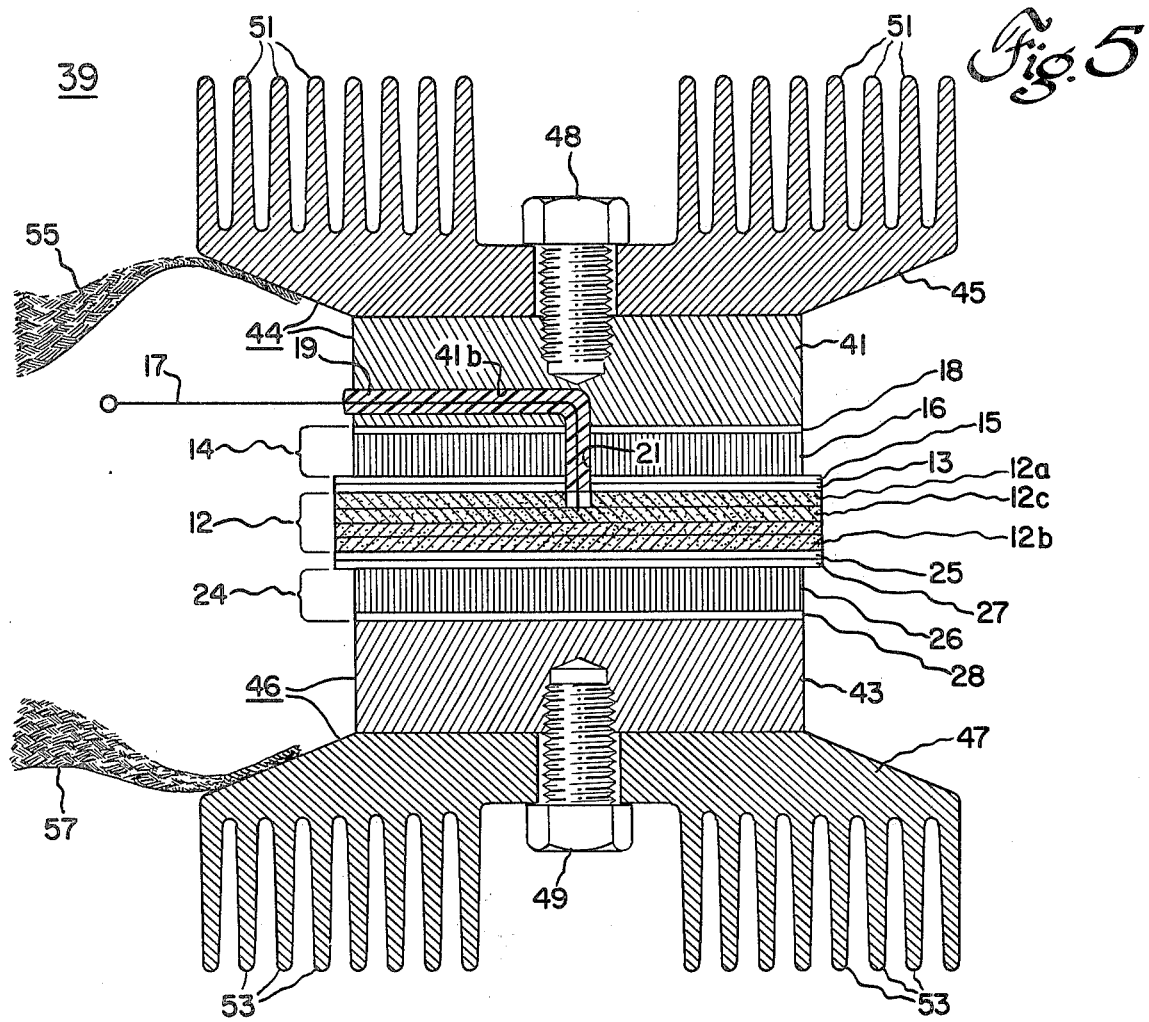
FIG. 5 is a cross-sectional view of another embodiment of the invention constructed with an air cooled heat sink.
Figure 6:
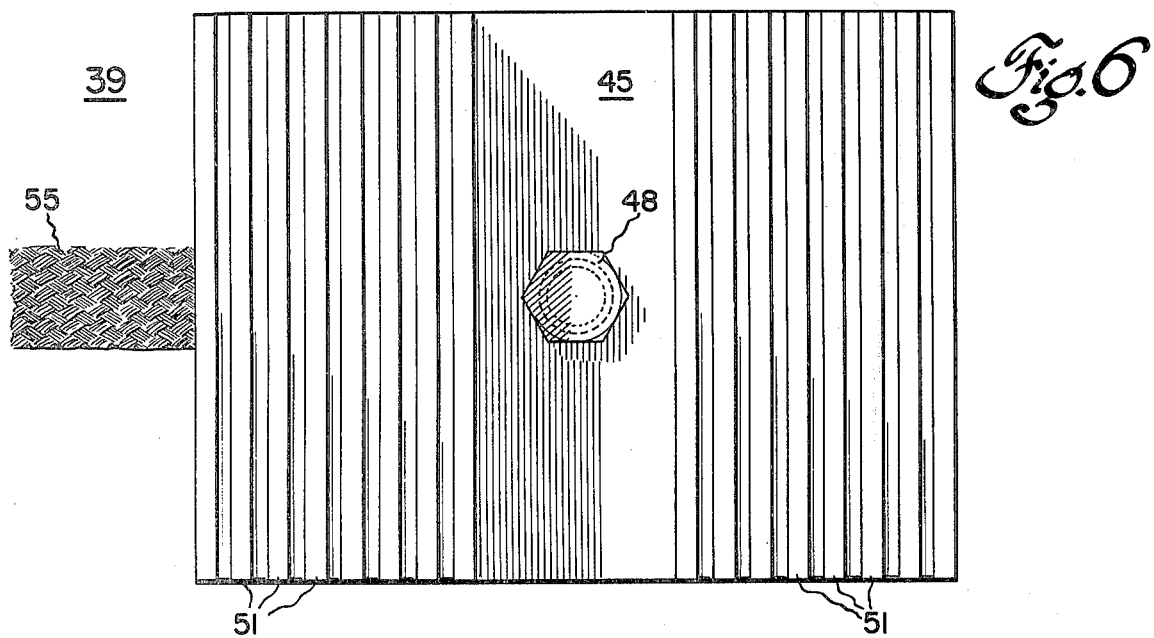
FIG. 6 is a top view of the embodiment of FIG. 5.

FIG. 5 depicts an air-cooled semiconductor device 39 similar in structure and function to the devices shown in FIGS. 1 and 3, except that air-cooled heat sinks 44 and 46 are used in place of heat sinks 20 and 30, respectively, of FIG. 1 and heat sinks 34 and 35, respectively, of FIG. 3. Air cooled heat sink 44 includes a block of metal 41 thermo-compression diffusion bonded to metallic sheet 18 of structured copper strain buffer 14. Heat sink 44 further includes a metallic fin structure 45 fastened to block 41 with a bolt 48. A plurality of fin-like heat dissipating projections 51 are included in fin structure 45. These projections are shown in top view in FIG. 6.

Air cooled heat sink 46 includes a metallic block 43 thermo-compression diffusion bonded to metallic sheet 28 of structured copper strain buffer 24. Heat sink 46 further includes fin structure 47 fastened to block 43 with a bolt 49. Alternately, fastening bolts 48 and 49 are not required if heat sinks 44 and 46 are each respectively fabricated as a single metallic member. That is, the fin structures and metallic blocks may be combined as one to form heat sinks 44 and 46.

Metallic braids 55 and 57 are connected to heat sinks 44 and 46, respectively, to facilitate connection of device 39 to external electrical circuitry.

In the embodiment of FIG. 5, silicon wafer 12 is depicted as a thyristor, although it could be a diode, transistor or other semiconductor device as well. Thyristor 12 includes a cathode 12a and anode 12b on opposite sides of the silicon wafer. Thyristor 12 includes a gate 12c situated on the cathode side of thyristor 12. Because of the presence of gate 12c in the interior of device 39, a means must be provided for connecting it to circuitry external to device 39. For example, FIG. 5 shows a channel 21 disposed above gate 12c and passing through strain buffer 14 and metallic layers 13 and 15. Block 41 includes a channel 41b with one end thereof in communication with channel 21 and the other end in communication with the external surface of block 41.

An electrically conductive wire 17 (gate lead) is situated in channels 41b and 21. Gate lead 17 is connected to gate 12c and is surrounded by electrically insulative material 19 to prevent it from contacting the metallic parts of device 39 and becoming electrically short-circuited thereto.

Figure 8:
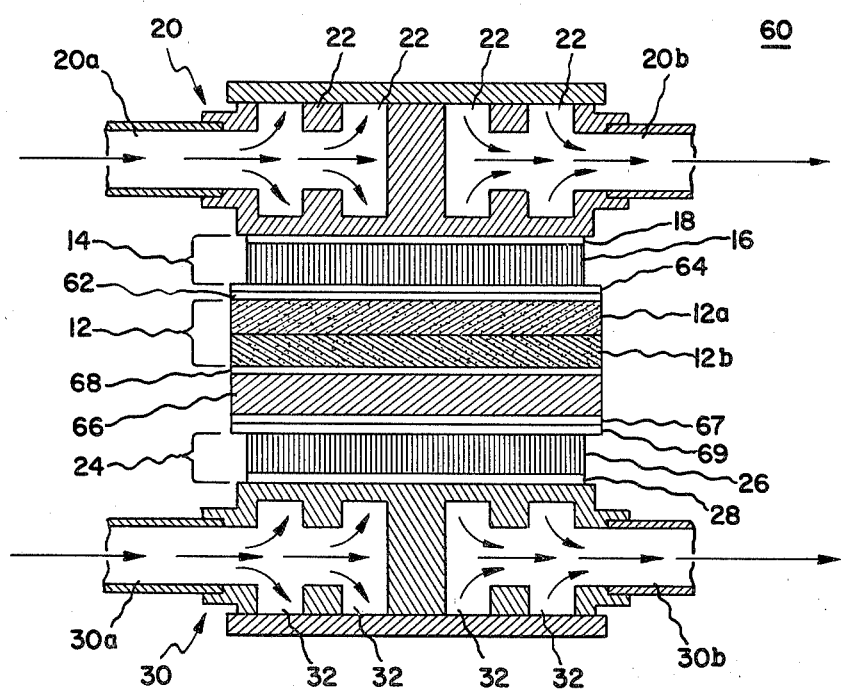
FIG. 8 is a cross-sectional view of another embodiment of the invention with thermo-compression diffusion bonds at selected interfaces of the device.

FIG. 8 shows another fluid cooled semiconductor device 60 without dry interfaces between the elements thereof. Semiconductor device 60 comprises a silicon wafer 12 with a cathode 12a and an anode 12b on opposite sides thereof. A first metallic layer 62 is deposited in contact with cathode 12a of silicon wafer 12. A second metallic layer 64 is deposited in contact with metallic layer 62 as shown in FIG. 8. Metallic layer 62 may be comprised of titanium, chromium or nickel and metallic layer 64 may be comprised of gold, silver or copper. One common end of the copper strands 16 of structured copper strain buffer 14 (fully described in the discussion of the semiconductor device 10 of FIG. 1) is thermo-compression diffusion bonded into metallic layer 64. The metallic sheet 18 of structured copper strain buffer 14 is thermo-compression diffusion bonded to fluid cooled heat sink 20 (also fully described above).

A support plate 66 is joined to the anode 12b of silicon wafer 12 via metallic braze 68 (an aluminum braze, for example) to provide structural integrity to the rather fragile wafer 12. Support plate 66 is comprised of tungsten, molybdenum or other metal with a thermal coefficient of expansion similar to that of silicon. A metallic layer 67 is deposited in contact with support plate 66 and a metallic layer 69 is deposited in contact with layer 67 as shown in FIG. 8. Metallic layer 67 may be comprised of such metals as titanium, chromium or nickel and metallic layer 69 may be comprised of gold, silver or copper. One common end of the copper strands 26 of structured copper stain buffer 24 is thermo-compression diffusion bonded to metallic layer 69. Fluid cooled heat sink 30 is thermo-compression diffusion bonded to metallic foil 28 of structured copper strain buffer 24.

To form the thermo-compression diffusion bond to such support plates (shown as 66 in FIG. 8, for example) and a structured copper strain buffer (24, for example), the surface of support plate 66 is first cleaned to remove any oxide coating therefrom. Sputter etching, for example, may be used to accomplish such cleaning. Metallic layer 67 comprised of titanium, nickel or chromium, for example, is then deposited on the cleaned surface of support plate 66. Metallic layer 69 comprised of copper, gold or silver, for example, is then deposited on metallic layer 66 to provide a bonding surface. Structured copper strain buffer 24 is then positioned in substantial abutment with metallic layer 69. The assembly formed by support plate 66, metallic layer 67 and 69 and structured copper strain buffer 24 (together with the remainder of the particular embodiment of the semiconductor device of the invention) is situated in press 40 of FIG. 7 between pressing block 46 and lower plate 44. It is generally desirable to form simultaneously as many of the thermo-compression diffusion bonds in the device of the invention as possible (excluding the structured copper strain buffers which are conveniently preformed). Thus, the entire device is situated in press 40 to form the desired diffusion bonds between the elements thereof.

In the manner described with regard to FIG. 7 above, bolts 58 and 59 of press 40 are tightened. Press 40 with the assembly to be bonded together contained therein is placed in an inert atmosphere. Press 40 is heated at a temperature within the range of 300° C.–400° C. which squeezes the assembly together at high pressure, typically 20,000 to 50,000 psi and causes the desired thermo-compression diffusion bonds to be formed. After an interval of about 15 minutes to 5 hours, the completed semiconductor device is removed from press 40.

The thermo-compression diffusion bonding method thus described may also be used to bond other copper members, in addition to structured copper members, to a support plate, such as 66. For example, a copper tab for electrical connection purposes may be bonded to a tungsten or molybdenum plate using this method.

Figure 9:
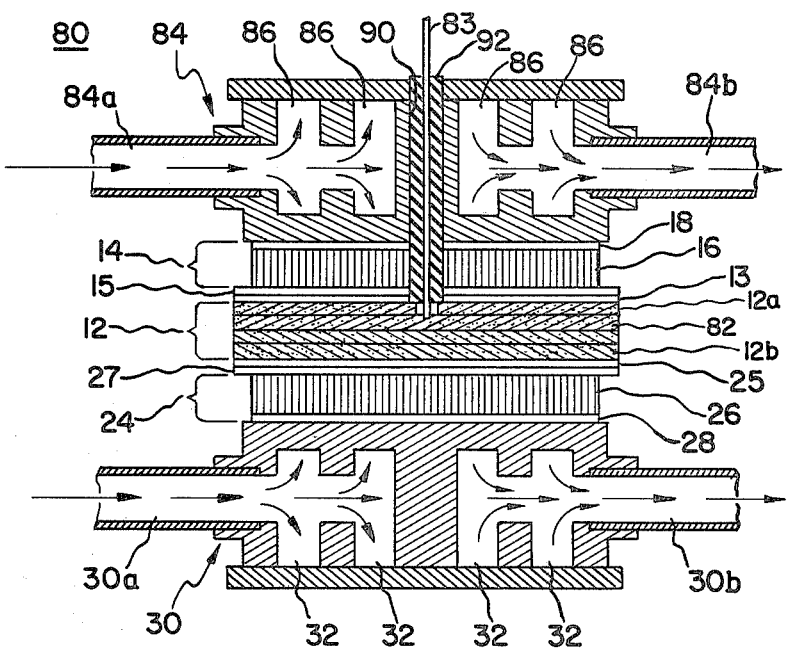
FIG. 9 is a cross-sectional view of a fluid cooled thyristor device with gate connecting means and with thermo-compression diffusion bonds at selected interfaces within the device.

FIG. 9 shows a fluid cooled thyristor device 80 which is similar to device 10 illustrated in FIG. 1 except for the following modifications. In device 80, semiconductor wafer 12 comprises a thyristor, with an anode 12b on one side thereof and a cathode 12a and a gate 82 on the opposite side thereof. In order to gain access to gate 82, it is necessary to provide gate connecting means 83 to facilitate connection of the gate to external circuitry. Thus, heat sink 84 and strain buffer 14 are provided with a hole 90 positioned above gate 82 such that a lead wire 83 may be connected to gate 82. With lead wire 83 in place and connected to gate 82, hole 90 is packed with an electrically insulating material 92 to prevent gate 82 from being short-circuited to heat sink 84 and strain buffer 14. Heat sink 84 is identical to the heat sink 30 of FIG. 1, except for aperture 90. Fluid inlet 84a and fluid outlet 84b of FIG. 6 correspond in structure and function to inlet 20a and outlet 20b, respectively, of FIG. 1, while fluid chamber 86 corresponds to fluid chamber 22 of FIG. 1. Heat sink 84 is situated atop, and thermo-compression diffusion bonded to, metallic sheet 16 of structured copper strain buffer 14.

Figure 10:
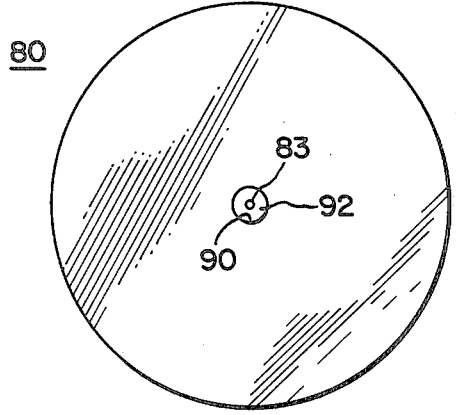
FIG. 10 is a top view of the fluid cooled thyristor device of FIG. 9.

FIG. 10 is a top view of fluid cooled thyristor device 80, showing the positioning of hole 90 and lead wire 83 as it passes through heat sink 84.

Figure 11:
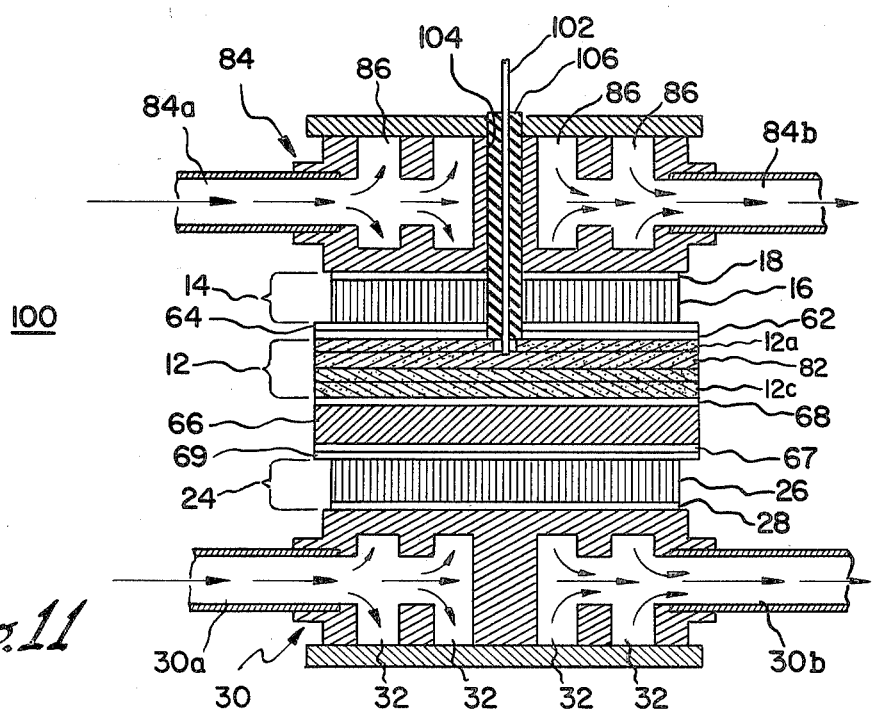
FIG. 11 is a cross-sectional view of a fluid cooled thyristor device with thermo-compression diffusion bonds at selected interfaces within the device.

FIG. 11 shows another embodiment of the fluid cooled thyristor device of the invention. Fluid cooled thyristor device 100 is substantially similar to fluid cooled semiconductor device 60 shown in FIG. 8 with the following exceptions. Silicon wafer 12 comprises a thyristor having an anode 12b on one side thereof and a cathode 12a and a gate 82 on the opposite side thereof. A heat sink 84 is constructed in the same manner as the heat sink illustrated in FIG. 9 and includes a hole 104 extending therethrough to provide a means for connecting a lead wire 102 to gate 82 located below heat sink 84. Hole 104 further extends through structured copper strain buffer 14 and metallic layers 62 and 64 and is situated above gate 82. Lead wire 102 passes from the area external to semiconductor device 100 through hole 104 and is connected to gate 82. Lead wire 102 is surrounded with an electrically insulating material 106 to prevent wire 102 from short-circuiting to heat sink 84, structured copper strain buffer 14 or metallic layers 62 and 64. Thus, gate 82 of thyristor 12 may be connected to circuitry external to semiconductor device 100.

Figure 12:
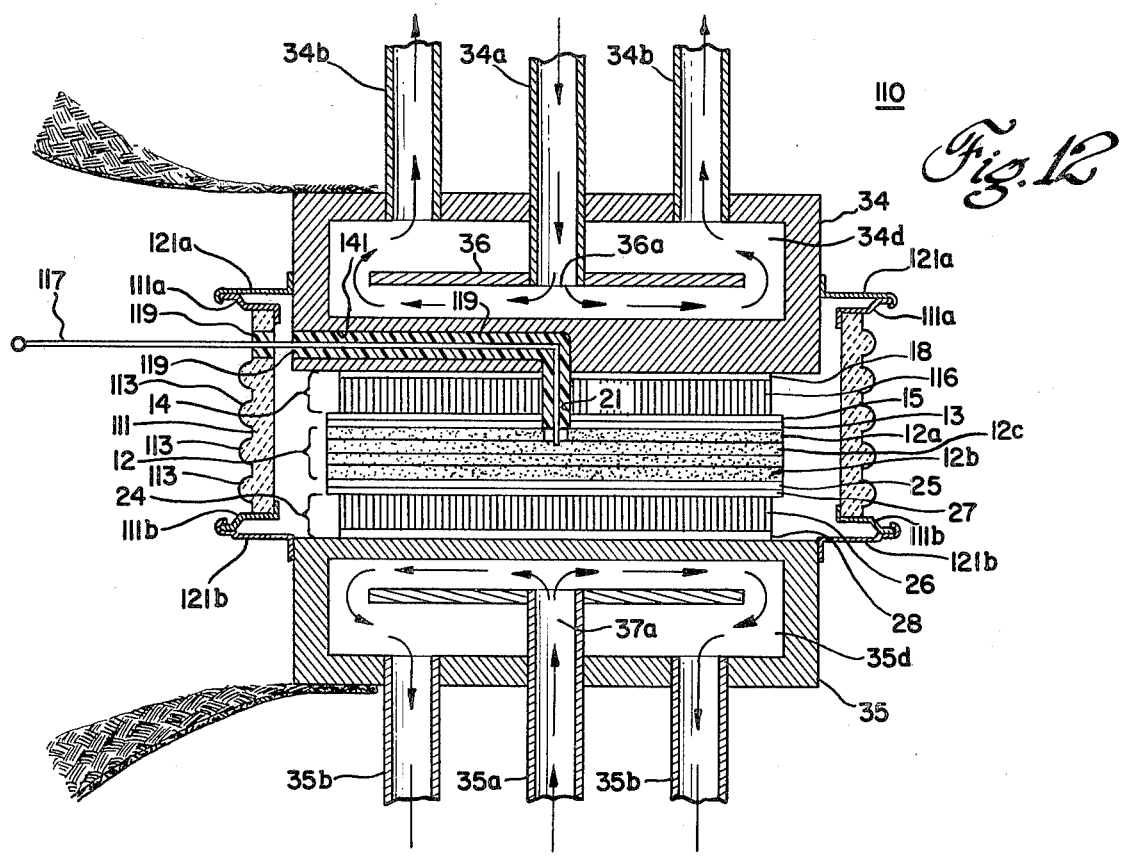
FIG. 12 is a cross-sectional view of a hermetically sealed fluid cooled semiconductor device made in accordance with the invention.

FIG. 12 shows another fluid cooled semiconductor device 110 which avoids the use of dry interfaces between the elements thereof. Semiconductor device 110 is a preferred embodiment and is similar to device 31 of FIG. 3 with the following exceptions. Silicon wafer 12 is a thyristor with a cathode 12a and an anode 12b on opposite sides thereof. A gate 12c is centrally situated on the cathode side of wafer 12. To connect gate 12c to circuitry external to device 110, a channel 21 is disposed above gate 12c and passes through metallic layers 13 and 15 and structured copper strain buffer 14. A channel 141 is situated in the portion of heat sink 34 below central plate 36. One end of channel 141 is situated in the portion of heat sink 34 below central plate 36. One end of channel 141 is in communication with channel 21 and the other end of channel 141 is in communication with the exterior of device 110. A portion of an electrically conductive wire 117 (gate lead) is situated in channels 21 and 141 and connected to gate 12c. As shown in FIG. 12, this portion of gate lead 117 is surrounded by electrically insulative material 119 to prevent lead 117 from short circuiting to other components of device 110. The remaining portion of gate lead 117 passes through a hole in housing 111 to the exterior of device 110. Gate lead 117 is sealed to this hole in housing 111.

Device 110 includes hermetically sealed housing 111 to protect the components of device 110 situated between heat sinks 34 and 35 from external contaminants as well as internal vapor condensation. In the embodiment shown in FIG. 12, housing 111 exhibits a ring-like shape with FIG. 12, housing 111 exhibits a ring-like shape with upper and lower surfaces. The geometry of housing 111 may vary to accommodate the particular size and shape of silicon wafer 12 and associated components used. Housing 111 is made of electrically insulative material such as a ceramic. The upper and lower surfaces of housing 111, respectively, include a metallic flange 111a and 111b. Flange 111a aligns with a metallic flange 121a extending from the lower portion of heat sink 34 as shown in FIG. 12. Flange 111b aligns with a metallic flange 121b extending from the upper portion of heat sink 35. The space enclosed by housing 111 is filled with a gas such as dry air, nitrogen or other gases to prevent the condensation of water vapor on the internal components of device 110. Flanges 111a and 111b are respectively hermetically sealed to flanges 121a and 121b to prevent the above-mentioned gas from escaping from device 110 and to prevent contaminants from reaching the internal components of device 110. Housing 111 is provided with circular ribs 113 to increase the effective voltage insulating capability of housing 111.

Figure 13:
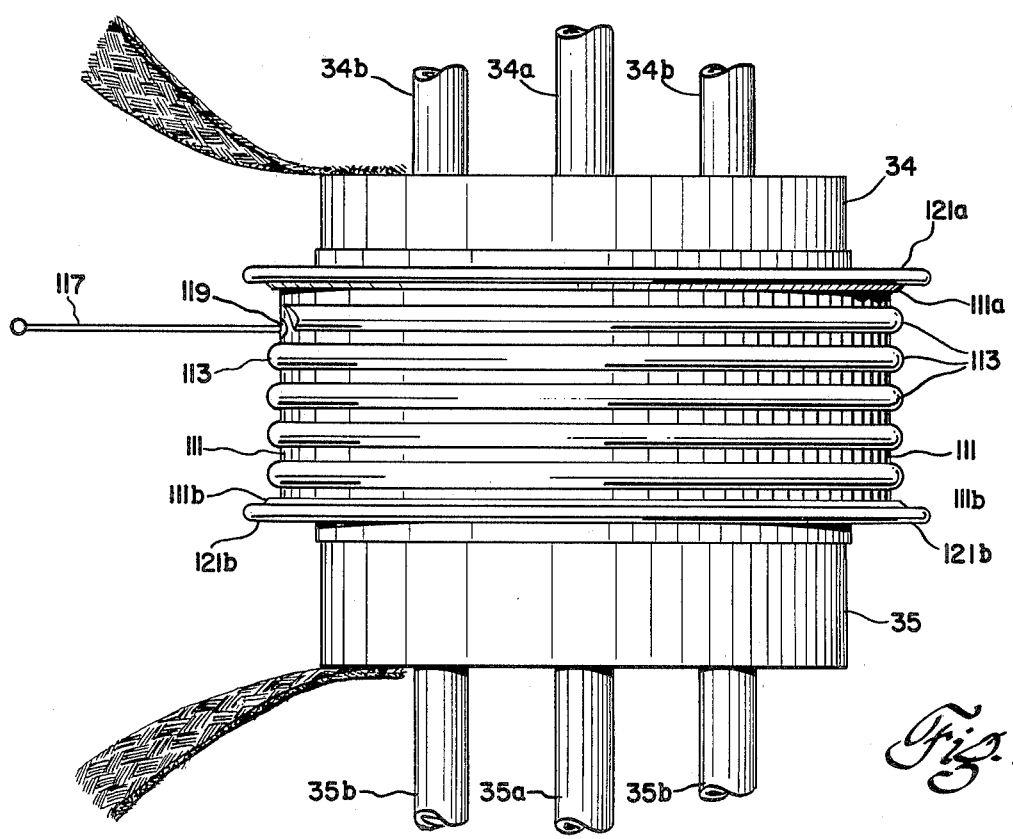
FIG. 13 is a side view of the embodiment of FIG. 12.

FIG. 13 is a side view of semiconductor device 110.

It should be understood that many variations of the particular semiconductor devices disclosed above are possible and are within the scope of the invention. Referring again to FIG. 12, for example, the invention may be practiced with or without hermetically sealed housing 111 although superior results are achieved when housing 111 is used. Silicon wafer 12 may comprise virtually any semiconductor device such as diodes, transistors and thyristors, for example, with means provided for connecting each electrode of the wafer to external electrical circuitry.

Either side of silicon wafer 12 may be attached to a metallic support plate having a thermal coefficient of expansion similar to that of silicon, such as tungsten and molybdenum, for example, to increase the structural integrity of the relatively fragile wafer 12. This wafer-plate assembly may be substituted for wafer 12. The remainder of the semiconductor device of the invention is constructed in the same manner as disclosed above.

Further embodiments of the invention are achieved in that strain buffers 14 and 24 of FIGS. 1, 3, 5, 8, 9, 11 and 13 may have a metallic sheet thermo-compression diffusion bonded to each side thereof, instead of, as depicted in the drawings with metallic sheets respectively bonded to one side thereof. In such further embodiments, it is important that the thickness of the metallic sheets closest to silicon wafer 12 be relatively thin, typically 1-3 mils thick. Somewhat smaller thicknesses of such metallic sheets may be used as well on larger thicknesses, providing the thickness is not so large as to significantly reduce the stress relieving capabilities of structured copper strain buffers 14 and 24. The thickness of the metallic sheets 18 and 28 (that is, the sheets furthest from silicon wafer 12) is typically in the range of $\frac{1}{2}$ mil to 20 mils, which is a thickness commensurate to that possessed by metallic foils, and conveniently lies in the range of 1-3 mils. Alternatively, thicknesses of metallic sheets 18 and 28 somewhat smaller than $\frac{1}{2}$ mil may be used, providing the thickness is sufficient to provide structural integrity to structured copper disks 16 and 26, respectively, joined thereto. As another alternative, the thickness of metallic sheets 18 and 28 may be larger than 20 mils, even so large as to form a block of metal, provided the thickness is not so large as to substantially increase the thermal resistance of strain buffers 14 and 24.

The foregoing describes a fluid cooled semiconductor device employing structured copper strain buffers to connect each side of a silicon wafer to respective fluid cooled heat sinking means. Thermo-compression diffusion bonds are used at the above described interfaces of the device, thereby eliminating dry interfaces. Electrical conductance to the electrodes of the device is thereby significantly increased while thermal conductance and capability to remove heat from the device are also increased.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

What is claimed is:

1. A cooled electronic semiconductor device for operation at high power levels with reduced internal stress comprising:

a silicon wafer with at least first and second electrodes on opposite sides of said wafer;

a first metallic layer atop said first electrode and joined thereto;

a second metallic layer atop said first metallic layer and joined thereto;

a first structured copper strain buffer including a bundle of substantially parallel closely packed strands of copper of substantially equal length, said first strain buffer having first and second opposed surfaces, one common end of said strands being thermo-compression diffusion bonded to a first metallic sheet so as to form said first opposed surface, the remaining second opposed surface of said first strain buffer being thermo-compression diffusion bonded to said second metallic layer;

first metallic heat sinking means for providing cooling of said device thermo-compression diffusion bonded to said first metallic sheet;

a third metallic layer below said second electrode and joined thereto;

a fourth metallic layer below said third metallic layer and joined thereto;

a second structured copper strain buffer including a bundle of substantially parallel, closely packed, strands of copper of substantially equal length, said second strain buffer having third and fourth opposed surfaces, one common end of said strands being thermo-compression diffusion bonded to a second metallic sheet so as to form said fourth opposed surface, the remaining third opposed surface of said second strain buffer being thermo-compression diffusion bonded to said fourth metallic layer; and second metallic heat sinking means for providing cooling of said device thermo-compression diffusion bonded to said second metallic sheet.

2. The electronic semiconductor device of claim 1 wherein said first strain buffer includes a third metallic sheet thermo-compression diffusion bonded to the remaining common end of the strands of said first strain buffer so as to form said second opposed surface.

3. The electronic semiconductor device of claim 2 wherein said second strain buffer includes a fourth metallic sheet thermo-compression diffusion bonded to the remaining common end of the strands of said second strain buffer so as to form said third opposed surface.

4. The electronic semiconductor device of claim 1 wherein each of said first and second metallic heat sinking means respectively comprises a block including a chamber with at least one inlet and at least one outlet for transporting heat conducting fluid therethrough.

5. The electronic semiconductor device of claim 3 wherein each of said first and second metallic heat sinking means respectively comprises a block including a chamber with at least one inlet and at least one outlet for transporting heat conducting fluid therethrough.

6. The electronic semiconductor device of claim 1 wherein each of said first and second metallic heat sinking means respectively comprises a block including a plurality of fin-like projections for dissipation of heat energy applied to said first and second heat sinking means.

7. The electronic semiconductor device of claim 3 wherein each of said first and second metallic heat sinking means respectively comprises a block including a plurality of fin-like projections for dissipation of heat energy applied to said first and second heat sinking means.

8. The electronic semiconductor device of claims 4, 5, 6 or 7 wherein said first and second metallic layers are comprised of one of the group consisting of titanium, chromium and nickel and said second and fourth metallic layers are comprised of one of the group consisting of silver, gold and copper.

9. The electronic semiconductor device of claims 1, 4, 5, 6 or 7 wherein said silicon wafer comprises a thyristor, said first and second electrodes comprising cathode and anode electrodes, respectively, said thyristor including a gate electrode, said semiconductor device including gate connecting means for providing electrical connection to said gate electrode.

10. A cooled electronic semiconductor device for operation at high power levels with reduced internal stress comprising:

a silicon wafer with at least first and second electrodes on opposite sides thereof;

a first metalic layer atop said first electrode and joined thereto;

a second metallic layer atop said first metallic layer and joined thereto;

a first structured copper strain buffer including a bundle of substantially parallel, closely packed, strands of copper of substantially equal length, said first strain buffer having first and second opposed surfaces, one common end of said strands being thermo-compression diffusion bonded to a first metallic sheet so as to form said first opposed surface, the remaining second opposed surface of said first strain buffer being thermo-compression diffusion bonded to said second metallic layer;

first metallic heat sinking means for providing cooling of said device thermo-compression diffusion bonded into said first metallic sheet;

a metallic support plate situated below the second electrode of said silicon wafer and operatively joined thereto;

a third metallic layer below said support plate and joined thereto;

a fourth metallic layer below said third metallic layer and joined thereto;

a second structured copper strain buffer including a bundle of substantially parallel, closely packed, strands of copper of substantially equal length, said second strain buffer having third and fourth opposed surfaces, one common end of said strands being thermo-compression diffusion bonded to a second metallic sheet so as to form said fourth opposed surface, the remaining third opposed surface of said second strain buffer being thermo-compression diffusion bonded to said fourth metallic layer; and second metallic heat sinking means for providing cooling of said device thermo-compression diffusion bonded into said second metallic sheet.

11. The electronic semiconductor device of claim 10 wherein said first strain buffer includes a third metallic sheet thermo-compression diffusion bonded to the remaining common end of the strands of said first strain buffer so as to form said second opposed surface.

12. The electronic semiconductor device of claim 11 wherein said second strain buffer includes a fourth metallic sheet thermo-compression diffusion bonded to the remaining common end of the strands of said second strain buffer so as to form said third opposed surface.

13. The electronic semiconductor device of claim 10 wherein each of said first and second metallic heat sinking means respectively comprises a block including a chamber with at least one inlet and at least one outlet for transporting heat conducting fluid therethrough.

14. The electronic semiconductor device of claim 12 wherein each of said first and second metallic heat sinking means respectively comprises a block including a chamber with at least one inlet and at least one outlet for transporting heat conducting fluid therethrough.

15. The electronic semiconductor device of claim 10 wherein each of said first and second metallic heat sinking means respectively comprises a block including a plurality of fin-like projections for dissipation of heat energy applied to said first and second heat sinking means.

16. The electronic semiconductor device of claim 12 wherein each of said first and second metallic heat sinking means respectively comprises a block including a plurality of fin-like projections for dissipation of heat energy applied to said first and second heat sinking means.

17. The electronic semiconductor device of claims 13, 14, 15 or 16 wherein said first and third metallic layers are comprises of one of the group consisting of titanium, chromium and nickel and said second and fourth metallic layers are comprised of one of the group consisting of silver, gold and copper.

18. The electronic semiconductor device of claims 10 or 12 wherein said support plate is comprised of one of a group consisting of tungsten and molybdenum.

19. The electronic semiconductor device of claims 10, 13, 14, 15 or 16 wherein said silicon wafer comprises a thyristor, said first and second electrodes comprising cathode and anode electrodes, respectively, said thyristor including a gate electrode, said semiconductor device including gate connecting means for providing electrical connection to said gate electrode.

20. A cooled semiconductor device for operation of high power levels with reduced internal stress comprising:
- a silicon wafer with at least first and second electrodes on opposite sides of said wafer;
- a first metallic layer atop said first electrode and joined thereto;
- a second metallic layer atop said first metallic layer and joined thereto;
- a structured copper strain buffer including a bundle of substantially parallel, closely packed, strands of copper of substantially equal length, said strain buffer having first and second opposed surfaces, one common end of said strands being thermo-compression diffusion bonded to a first metallic sheet so as to form said first opposed surface, the remaining second opposed surface of said strain buffer being thermo-compression diffusion bonded to said second metallic layer;
- metallic heat sinking means for providing cooling of said device thermo-compression diffusion bonded to said first metallic sheet; and
- electrical contact means for making electrical connection to said device operatively connected to each electrode on the side of said wafer including said second electrode.

21. The electronic semiconductor device of claim 20 wherein said strain buffer includes a second metallic sheet thermo-compression diffusion bonded to the remaining common end of the strands of said strain buffer so as to form said second opposed surface.

22. A cooled semiconductor device for operation at high power levels with reduced internal stress comprising:
- a first metallic layer atop said first electrode and joined thereto;
- a second metallic layer atop said second electrode and joined thereto;
- a structured copper strain buffer including a bundle of substantially parallel, closely packed, strands of copper of substantially equal length, said strain buffer having first and second opposed surfaces, one common end of said strands being thermo-compression diffusion bonded to a first metallic sheet so as to form said first opposed surface, the remaining second opposed surface of said strain buffer being thermo-compression diffusion bonded to said second metallic layer;
- metallic heat sinking means for providing cooling of said device thermo-compression diffusion bonded to said first metallic sheet;
- a metallic support plate situated below the second electrode of said silicon wafer and operatively joined thereto; and
- electrical contact means for making electrical connection to said device operatively connected to said metallic support plate.

23. The electronic semiconductor device of claim 22 wherein said strain buffer includes a second metallic sheet thermo-compression diffusion bonded to the remaining common end to the strands of said strain buffer so as to form said second opposed surface.

* * * * *